US007245186B2

(12) United States Patent
Chang et al.

(10) Patent No.: US 7,245,186 B2
(45) Date of Patent: Jul. 17, 2007

(54) BANDPASS AMPLIFIER

(75) Inventors: Sheng Fuh Chang, Hsinchu (TW); Jia Liang Chen, Hsinchu (TW); Cherng Cherng Liu, Hsinchu (TW); Hung Cheng Chen, Hsinchu (TW); Shu Fen Tang, Hsinchu (TW); Albert Chen, Hsinchu (TW)

(73) Assignees: Integrated System Solution Corp., Hsinchu (TW); Sheng-Fuh Chang, Hsinchu (TW)

( * ) Notice: Subject to any disclaimer, the term of this patent is extended or adjusted under 35 U.S.C. 154(b) by 2 days.

(21) Appl. No.: 10/882,215

(22) Filed: Jul. 2, 2004

(65) Prior Publication Data

US 2006/0001492 A1 Jan. 5, 2006

(51) Int. Cl.
*H03F 3/04* (2006.01)

(52) U.S. Cl. .............. 330/302; 330/303; 330/306; 327/552; 327/557; 333/32; 333/170

(58) Field of Classification Search ............... 330/302, 330/303, 306; 327/552, 557; 333/32, 170
See application file for complete search history.

(56) References Cited

U.S. PATENT DOCUMENTS

| 4,984,292 A | | 1/1991 | Millen ................. 455/40 |
| 5,051,706 A | * | 9/1991 | Zushi ................. 330/277 |
| 5,339,047 A | * | 8/1994 | Mizan et al. ........... 330/286 |
| 5,880,633 A | * | 3/1999 | Leizerovich et al. ....... 330/84 |
| 2003/0184378 A1 | | 10/2003 | Segawa ................ 330/254 |

OTHER PUBLICATIONS

Krauss et al. "Solid state radio engineering" John Wiley and Sons copyright 1980 p. 3.*
Article entitled "20-30GHz broadband MMIC power amplifiers with compact flat gain PHEMT cells" by Sasaki et al. published by IEEE 2001 MTT-S Digest, pp. 1067-1070.
Article entitled "A 3V, 1.6 GHz Differential CMOS Bandpass Amplifier Chain for a GPS Receiver" by E. Hernandez et al. published by Escucla Superior de Ingenieros Industriales de San Sebastian (Universidad de Navarra) Spain, p. 33-37.
Article entitled "A Filter Synthesis Technique Applied to the Design of Multistage Broadband Microwave Amplifiers" by John-Paul Rooney et al., published by Institute of Microwaves and Photonics, School of Electronic and Electrical Engineering, University of Leeds, pp. 1915-1918.
Article entitled "A Si Bipolar Monolithic RF Bandpass Amplifier" by Nhat M. Nguyen et al., published in the IEEE Journal of Solid State Circuits, vol. 27, No. 1, Jan. 1992, pp. 123-127.

* cited by examiner

*Primary Examiner*—Michael B Shingleton
(74) *Attorney, Agent, or Firm*—Pillsbury Winthrop Shaw Pittman, LLP

(57) ABSTRACT

The present invention discloses a bandpass amplifier having gain and bandpass performance. The bandpass amplifier includes an input match unit for matching the gain of the amplifier and having a first filter response; a first bias unit electrically connected to the input match unit for driving the first terminal of the amplifier and having a first high pass filter response; a gain stage electrically connected to the first bias unit for providing the flat gain of the amplifier; a second bias unit electrically connected to the gain stage for driving the second terminal of the amplifier and having a second high pass filter response; and an output match unit electrically connected to the second bias unit for matching the gain of the amplifier and having a second filter response.

20 Claims, 6 Drawing Sheets

BANDPASS AMPLIFIER

BACKGROUND OF THE INVENTION

1. Field of the Invention

The present invention generally relates to a monolithic microwave integrated circuit (MMIC), and more particularly to an amplifier having gain and bandpass filter performance for microwave and millimeter-wave wireless communication system.

2. Description of the Related Art

In the microwave and millimeter-wave range, the high integration of MMICs is 3333 increasingly demanded for a variety of applications such as wireless broadband systems, mobile communication systems at 40 GHz and 60 GHz, high-speed millimeter-wave local area networks at 59-62 GHz, and automotive sensors at 24 GHz and 77 GHz. In typical RF transceivers, MMIC chips and off-chip filters are obtained to achieve maximum performance and lowest cost. But the off-chip filters, including band-selection filters and image-rejection filters, are bulky and relatively expensive to hinder the cost reduction. This concept of bandpass amplifier described by Nguyen et al in "A Si bipolar monolithic RF bandpass amplifier," *IEEE J. Solid-State Circuits*, vol. 27, no. 1, pp. 123-127, January 1992, has been proposed that the bandpass response is created by the resultant shunt resonator formed by the added inductor with the base-emitter capacitor. They showed an 8-dB gain and 6.4-dB noise figure at 1.5 GHz. A CMOS bandpass amplifier such as described by Wu et al in "The design of a 3-V 900-MHz CMOS bandpass amplifier," *IEEE J. Solid-State Circuits*, vol. 32, no. 2, pp. 159-1687, February 1997, was obtained in the 869-893 MHz range by using the positive-feedback Q-enhancement technique. For GPS applications, a 1.6-GHz CMOS bandpass amplifier such as described by Hernandez et al in "A 3 V, 1.6 GHz differential CMOS bandpass amplifier chain for a GPS receiver," 2000 *Topical Meeting on Silicon Monolithic Integrated Circuits in RF Systems Digest*, April 2000, pp. 33-37, was designed by incorporating a LC tank at the drain terminal to have bandpass effect. Although the above results show successful single-chip integration of a gain amplifier with a bandpass filter, it is limited below several GHz range. In the millimeter-wave range, a PHEMT bandpass power amplifier such as described by Sasaki et al in, "20-30 GHz broadband MMIC power amplifiers with compact flat gain PHEMT cells," 2001 *IEEE MTT-S Int. Microwave Symp. Dig.*, June 2001, pp. 1067-1918, had 21-dB gain and 22-dBm $P_{dB}$ over the passband frequency from 20 to 30 GHz. A 4-GHz lowpass amplifier, having the Butterworth or Chebyshev filter approximation was described by Rooney et al in "A filter synthesis technique applied to the design of multistage broadband microwave amplifiers," 2002 *IEEE MTT-S Int. Microwave Symp. Dig.*, June 2002, pp. 1915-1918.

U.S. Pat. No. 4,984,292 issued to Millen., entitled "Bandpass amplifier and receiver using bandpass amplifier", discloses that an active bandpass amplifier comprising a single stage operational amplifier, a bridged "T" network single-frequency elimination filter in the negative feedback path of the amplifier and a phase-shift-correcting capacitor associated with the bridged "T" network single-frequency elimination filter to generate a phase shift sufficient to maintain an appropriate feedback such that the amplifier is stable. The bridged "T" network single frequency elimination filter in conjunction with the circuit capacitances and phase shifts in the integrated circuits introduces a phase shift, which would result in the amplifier oscillating when the network is placed in the feedback path and the corrective capacitor generates a corrective phase shift to render the amplifier stable. Such a bandpass amplifier allows high gain and high "Q" and the gain is many times higher than that of a conventional single stage amplifier where gain is typically limited to approximately 5 and the "Q" is limited to about 25. In this case, the bandpass amplifier is capable of gains of greater than 10 and substantially higher "Q". Such an amplifier is advantageously used in a receiver and in a signaling system. The high gain capability of the receiver is particularly advantageous in a mining environment where the receiver can be used as part of a signalling system. United States Patent Application 20030184378 by Segawa, entitled "Mixer and differential amplifier having bandpass frequency selectivity", discloses a mixer and a differential amplifier are formed using simple circuit configurations such that the cutoff frequencies thereof can be easily changed. Each of the mixer and the differential amplifier includes an NMOS transistor to which an RF signal is fed, NMOS transistors to which an LO– signal and an LO+ signal are respectively fed from a local oscillator, and two parallel resonant circuits each serving as an output load and including an active inductor, a capacitor, and a resistor. However, it is not yet found on the single-chip bandpass amplifier design in the microwave to millimeter-wave range. According the above problems, the related filed need a new amplifier to overcome the disadvantage of the prior art.

BRIEF SUMMARY OF THE INVENTION

It is an objective of the present invention to provide a bandpass amplifier on the single-chip in the microwave to millimeter-wave range.

It is the second objective of the present invention to provide a bandpass circuit on the single-chip having positive gain performance in the microwave to millimeter-wave range.

It is the third objective of the present invention to provide a RF receiver without the requirement of the passive bandpass filter, so that the chip size and fabrication cost is reduced.

To achieve the above objectives, the present invention provides an amplifier with three terminals, having a bandpass filter performance. The amplifier comprises an input match unit, a first bias unit, electrically connected to the input match unit; a gain stage, electrically connected to the first bias unit; a second bias unit, electrically connected to the gain stage and an output match unit, electrically connected to the second bias unit. The input match unit is used for matching the gain of the amplifier and having a first filter response. The first bias unit is used for driving the first terminal of the amplifier and having a first high pass filter response. The gain stage is used for providing the flat gain of the amplifier. The second bias unit is used for driving the second terminal of the amplifier and having a second high pass filter response. The output match unit is used for matching the gain of the amplifier and having a pass filter response.

According to one aspect of the present invention, the first filter response is a low pass filter response and the second filter response is a second low pass filter response, respectively.

According to one aspect of the present invention, the input match unit and the output match unit of the amplifier are a first T network and a second T network each comprising the inductors and capacitors, resulting for matching the gain of the amplifier and having the first low pass filter response and the second low pass filter response, respectively.

According to another aspect of the present invention, the first bias unit and the second bias unit of the amplifier are a first L network and a second L network each comprising the inductors and capacitors, resulting for driving the first and second terminal of the amplifier and having the first and second high pass filter response, respectively.

To achieve the objectives, the present invention provides a filter circuit, having a gain performance. The filter circuit comprises a first T network; a first L network, electrically connected to the first T network; a second L network; a second T network, electrically connected to the second L network; and a three-terminal amplifying device, having a first terminal electrically connected to the first L network, a second terminal connected to the second L network and a third terminal connected to a common ground. The first T network comprises the inductors and capacitors for having a first low pass filter response. The first L network comprises the inductors and capacitors for having a first high pass filter response. The second L network comprises the inductors and capacitors for having a second high pass filter response. The second T network comprises the inductors and capacitors for having a second low pass filter response. The three-terminal amplifying device is used for providing the flat gain of the bandpass circuit. And, the first T network and the second T network match the gain of the amplifying device; and the first L network drives the first terminal of the amplifying device and the second L network drives the second terminal of the amplifying device.

To achieve the objectives, the present invention provides a receiver comprising an antenna, a first bandpass amplifier, a mixer having an associated local oscillator, a second bandpass amplifier, and a detector means for determining whether a particular signal has been received. The first and second bandpass amplifiers according to the present invention in the first objective each comprise an input match unit; a first bias unit, electrically connected to the input match unit; a gain stage, electrically connected to the first bias unit; a second bias unit, electrically connected to the gain stage; and an output match unit, electrically connected to the second bias unit.

BRIEF DESCRIPTION OF THE DRAWINGS

All the objects, advantages, and novel features of the invention will become more apparent from the following detailed descriptions when taken in conjunction with the accompanying drawings.

DETAILED DESCRIPTION OF THE INVENTION

Although the invention has been explained in relation to several preferred embodiments, the accompanying drawings and the following detailed descriptions are the preferred embodiment of the present invention. It is to be understood that the following disclosed descriptions will be examples of present invention, and will not limit the present invention into the drawings and the special embodiment.

Figure 11:
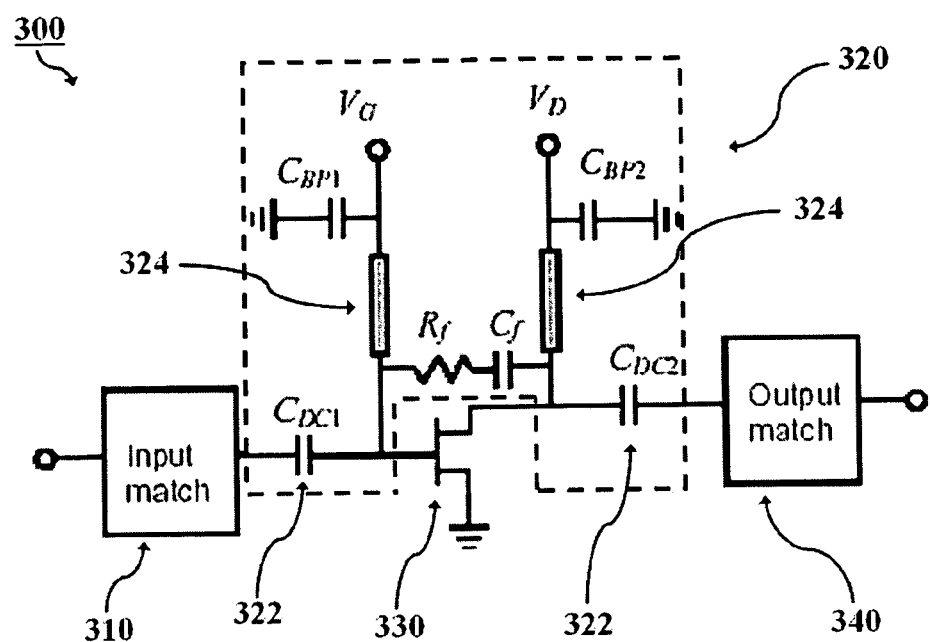
FIG. 11 shows a schematic of a conventional single-stage bandpass amplifier of prior art.

To understand the spirit of the present invention, the conventional single-stage amplifier of prior art is introduced first. Referring to FIG. 11, it shows a schematic of a conventional single-stage amplifier. The amplifier 300 mainly comprises an input match unit 310, a bias unit 320, a gain stage 330, and an output match unit 340. The input match unit 310 and the output match unit 340 are used to match the gain condition of the gain stage 330, and are realized with the transmission line, where the design parameters of the transmission line are calculated from the Smith chart. The bias unit 320 is used to drive the amplifier 300 into a proper bias condition, and a capacitor 322 in the bias unit 320 is used for DC blocking and an inductor 324 is used for RF chocking.

The integration of a gain amplifier with a bandpass filter of the present invention is resulted from the treatment of the match network as a lowpass filter and the bias network as a highpass filter. Now referring to FIG. 1, it shows a schematic of a single-stage bandpass amplifier according to the first embodiment of the present invention. The bandpass amplifier 5 comprises an input match unit 10, a first bias unit 20, electrically connected to the input match unit 10; a gain stage 30, electrically connected to the first bias unit 20; a second bias unit 40, electrically connected to the gain stage 30, and an output match unit 50, electrically connected to the second bias unit 40. The input match unit 10 is used for matching and then maximizing the gain of the bandpass amplifier 5 and having a first low pass filter response. The first bias unit 20 is used for driving the first terminal of the bandpass amplifier 5 and having a first high pass filter response. The gain stage 30 is used for providing the flat gain of the bandpass amplifier 5. The second bias unit 40 is used for driving the second terminal of the bandpass amplifier 5 and having a second high pass filter response. The output match unit 50 is used for matching and then maximizing the gain of the bandpass amplifier 5 and having a second low pass filter response.

It is noted that the input match unit 10 using the lowpass T configuration is chosen here for input gain match of the bandpass amplifier 5 as well as for the generation of a first lowpass filter response. The followed first bias unit 20 is originally to drive the bandpass amplifier 5 into a proper bias condition without altering RF signal transmission, but its filtering nature is to have a first highpass filter response. Thus the cascade of the first lowpass response in the input match unit 10 and the first highpass response in the first bias unit 20 generates a first bandpass response. The same treatment is applied to the output match unit 50 and the second bias unit 40, and the cascade of the second lowpass response in the output match unit 50 and the second highpass response in the second bias unit 40 generates a second bandpass response. It is noted the center frequency of the first bandpass response and the second bandpass response is required to the same, while the first lowpass response in the input match unit 10 is not limited to the same with the second lowpass response in the output match unit 50 and the first highpass response in the first bias unit 20 is not limited to the same with the second highpass response in the second bias unit 40. Therefore, the bandpass filter response of the bandpass amplifier will have a plurality of the transmission zeros near the passband edges to have high attenuation rate and broad stopband. The gain stage 30 is designed to provide flat gain over the passband range. In the case of the gain stage 30, the circuit is appropriately optimized to provide low noise, moderate-to-high gain, or substantial output power.

Therefore the bandpass amplifier 5 becomes a filter chain, composed of multiple cascaded filter cells, such as the input match unit 10, the first bias unit 20, the second bias unit 40 and the output match unit 50. The image-parameter filter method according to G. L. Matthaei et al, "Microwave Filters, Impedance-Matching Networks and Coupling Strustures", New York, McGraw Hill, 1980, is referenced to determine the elements of the input match unit 10, the first bias unit 20, the second bias unit 40 and the output match unit 50, since it has advantages of simplifying a high-order filter as cascade of several elementary filter cells so that the resultant performance is obtained simply by the matrix multiplication of all cells.

Figure 1:
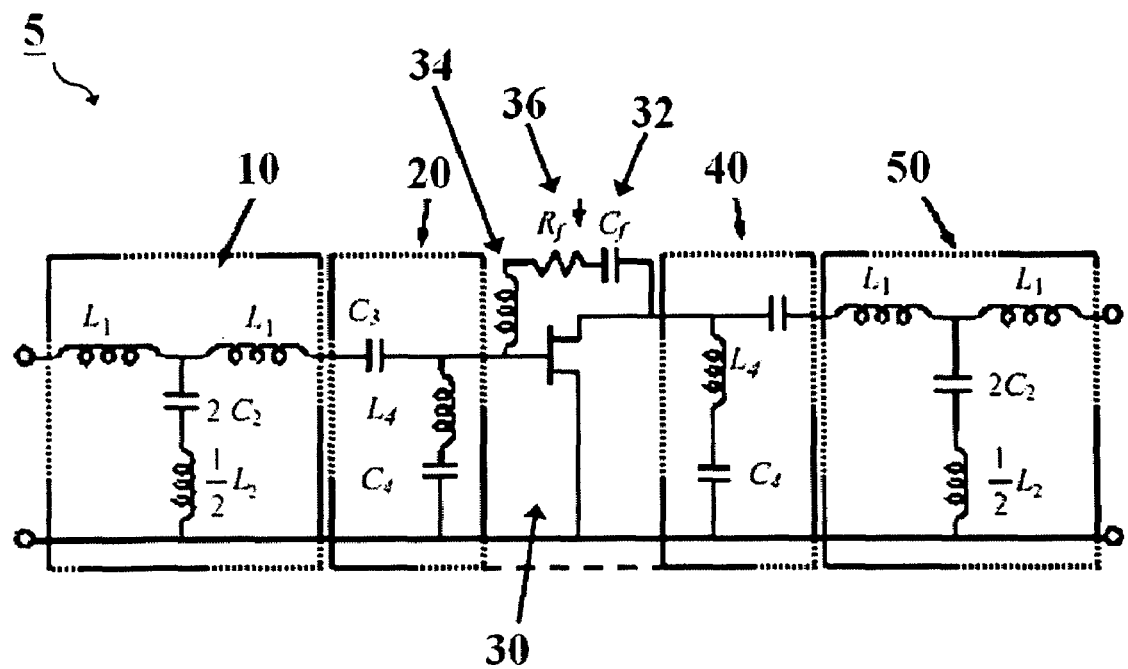
FIG. 1 shows a schematic of a single-stage bandpass amplifier according to the first embodiment of the present invention.
Figure 2:
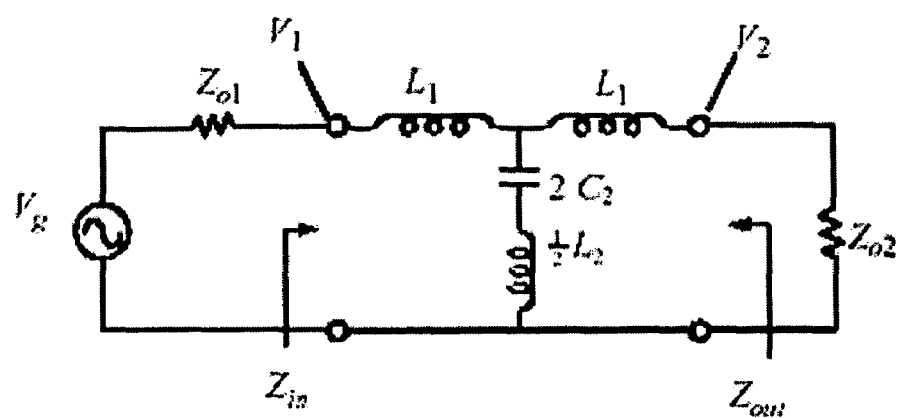
FIG. 2 shows the equivalent circuit of the input match unit in FIG. 1 according to the first embodiment of the present invention.

Now referring to FIG. 2, it shows the equivalent circuit of the input match unit 10 in FIG. 1 according to the first embodiment of the present invention. The input match unit 10 is a first T network comprising the inductors $L_1$, $L_2$ and capacitors $C_2$, resulting for matching the gain of the amplifier 5 and having the first low pass filter response. Note that, the first T network is terminated with impedance $Z_{o1}$ and $Z_{o2}$ at the input and output ports, representing the equivalent impedance of the left and right part of the input match unit 10. $\omega_{cT}$ is called the angular cutoff frequency and $\omega_{zT}$ is the angular transmission-zero frequency of the first low pass filter response, generated from the series resonance of the shunt branch in the first T network. And $\omega_{cT}$ and $\omega_{zT}$ they are expressed as:

$$\omega_{cT} = \frac{1}{\sqrt{(L_1+L_2)C_2}} \quad (1)$$

$$\omega_{zT} = \frac{1}{\sqrt{L_2 C_2}}. \quad (2)$$

The inductance of the inductors $L_1$, $L_2$ and the capacitance of the capacitors $C_2$ in the first T network are determined by the cutoff frequency and the transmission zero frequency of the first low pass filter response, and a first image impendence of the first T network. The first image impendence of the first T network matches the input and output impendence of the first T network to match the gain of the bandpass amplifier 5.

The existence of the transmission-zero is particularly useful for the enhancement of stop-band attenuation of the bandpass amplifier 5. Hence the transmission-zero frequency $\omega_{zT}$ can be chosen close to the cutoff frequency $\omega_{cT}$ to generate strong band transition or can be chosen at the frequency where the interference exists. The cutoff frequency $\omega_{cT}$ and transmission-zero frequency $\omega_{zT}$ can be conveniently related by a factor:

$$m_T = \sqrt{1 - \omega^2_{cT}/\omega^2_{zT}} \quad (3)$$

For simultaneously matching and maximizing the gain of the amplifier 5 at input and output ports, $Z_{o1}$ must equal to the input impedance $Z_{in}$ of the input match unit 10 and $Z_{o2}$ must equal to the output impedance $Z_{out}$ of the input match unit 10. Therefore, the so-called first image impedance $Z_{iT}$ is given by the equation:

$$Z_{in} = Z_{out} \equiv Z_{iT} = R_{oT}\sqrt{1 - \frac{\omega^2}{\omega^2_{cT}}} \quad (4)$$

wherein $$R_{oT} = \sqrt{\frac{L_1}{C_2}}$$

is the image impedance at DC. From Eq. (1)-(4), the circuit elements can be calculated in terms of $\omega_{cT}$, $\omega_{zT}$ and $R_{oT}$, given by the equations:

$$L_1 = m_T \frac{R_{oT}}{\omega_{cT}} \quad (5)$$

$$L_2 = \frac{1-m_T^2}{m_T} \frac{R_{oT}}{\omega_{cT}} \quad (6)$$

$$C_2 = m_T \frac{1}{\omega_{cT} R_{oT}}. \quad (7)$$

Figure 3:
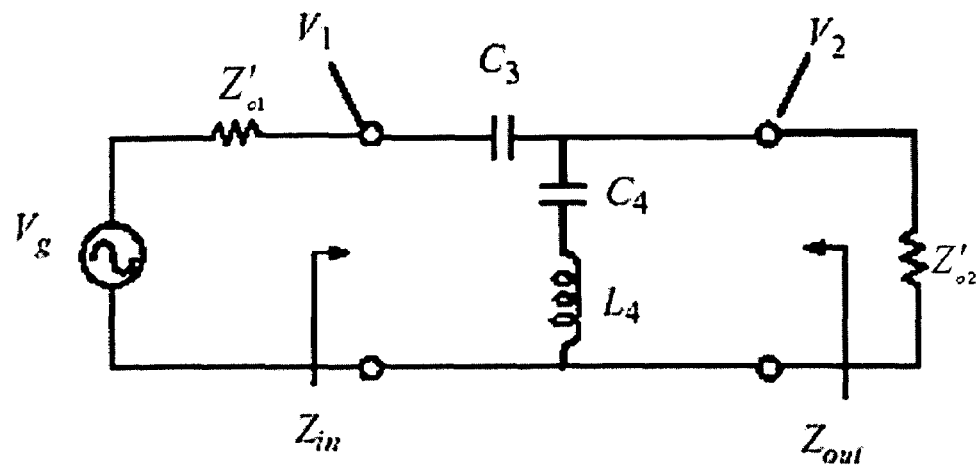
FIG. 3 shows the equivalent circuit of the first bias unit in FIG. 1 according to the first embodiment of the present invention.

Now referring to FIG. 3, it shows the equivalent circuit of the first bias match unit in FIG. 1 according to the first embodiment of the present invention. The first bias unit 20 is a first L network comprising the inductor $L_3$ and capacitors $C_3$ and $C_4$, resulting for driving the first terminal of the amplifier and having the first high pass filter response. Note that, the first L network is terminated with impedance $Z'_{o1}$ and $Z'_{o2}$ at the input and output ports, representing the equivalent impedance of the left and right part of the first bias unit 20. The inductance of the inductor $L_3$ and the capacitance of the capacitors $C_3$ and $C_4$ in the first L network are determined by the cutoff frequency $\omega_{cL}$ and the transmission zero frequency $\omega_{zL}$ of the first high pass filter response, and a second image impendence of the L network. And $\omega_{cL}$ and $\omega_{zL}$ they are expressed as:

$$\omega_{cL} = \sqrt{\frac{1}{L_4}\left(\frac{1}{C_3} + \frac{1}{C_4}\right)} \qquad (8)$$

$$\omega_{zL} = \frac{1}{\sqrt{L_4 C_4}}. \qquad (9)$$

The second image impendence of the first L network matches the input and output impendence of the first L network to drive the first terminal of the bandpass amplifier 5. $\omega_{cL}$ is called the angular cutoff frequency and $\omega_{zL}$ is the angular transmission-zero frequency the first highpass filter response, generated from the series resonance of the shunt branch in the first L network. The existence of the transmission-zero is also particularly useful for the enhancement of stop-band attenuation of the bandpass amplifier 5. The cutoff frequency $\omega_{cL}$ and transmission-zero frequency $\omega_{zL}$ can be conveniently related by a factor:

$$m_L = \infty\sqrt{1-\omega^2_{cL}/\omega^2_{zL}} \qquad (10)$$

For matching the gain of the amplifier 5, $Z'_{o1}$ must equal to the input impedance $Z_{in}$ of the first bias unit 20 and $Z'_{o2}$ must equal to the output impedance $Z'_{out}$ of the first bias unit 20. Therefore, the so-called second image impedance $Z_{iL}$ is given by the equation:

$$Z'_{in} = Z'_{out} \equiv Z_{iL} = R_{oL}\sqrt{1-\frac{\omega^2}{\omega^2_{cL}}} \qquad (11)$$

wherein $$R_{oL} = \sqrt{\frac{L_4}{C_3}}$$

is the image impedance at DC. From Eq. (8)-(11), the circuit elements can be calculated in terms of $\omega_{cL}$, $\omega_{zL}$ and $R_{oL}$, given by the equations:

$$C_3 = \frac{1}{m_L}\frac{1}{\omega_{cL}R_{oL}} \qquad (12)$$

$$C_4 = \frac{m_L}{1-m_L^2}\frac{1}{\omega_{cL}R_{oL}} \qquad (13)$$

$$L_4 = \frac{1}{m_L}\frac{R_{oL}}{\omega_{cL}}. \qquad (14)$$

The gain stage 30 is designed such that it offers flat gain over the desired passband range. The types of the gain stage 30 which can be implemented include: Bipolar Junction Transistor (BJT), Heterojunction Bipolar Transistor (HBT), High Electronic Mobility Transistor (HEMT), Pseudomorphic HEMT (PHEMT), Complementary Metal Oxide Semiconductor Filed Effect Transistor (CMOS) and Laterally Diffused Metal Oxide Semiconductor Filed Effect Transistor (LDMOS). Preferably, PHEMT is suitable for the gain stage 30 in the microwave to millimeter wave range. Semiconductor materials broadly applicable to the banpass amplifier 5 include: silicon, silicon-on-insulator (SOI), silicon-germanium (SiGe), gallium arsenide (GaAs), indium phosphide (InP) and silicon-germanium-carbon (SiGe—C). Preferably, the gain stage 30 is designed with resistive shunt-feedback PHEMT transistors on semiconductor substrate of Al—In—GaAs compound. Depending on the required gain value, the gain stage 30 can be either single stage or multiple stages. The first terminal of the bandpass amplifier 5 driven by the first bias unit 20 is the gate bias and the second terminal of the bandpass amplifier 5 driven by the second bias unit 40 is the drain bias in the embodiment; however, they are not limited and depending on the design requirement of the amplifier.

Referring to the FIG. 1, the bandpass amplifier 5 with a resistive shunt feedback network, where the capacitor 32 is used for DC blocking from the drain bias interfering the gate bias, and its combination with the inductor 34 gives the proper feedback phase. The bandpass amplifier 5 actually contains multiple feedback paths. One is the external shunt feedback path through capacitor 32, inductor 34 and resistor 36 and the others are the internal feedback paths through the drain-gain capacitor. The scattering parameters of this multiple-feedback bandpass amplifier 5, terminated with source and load impedances of $Z_{o1S}$ and $Z_{o2L}$ respectively, can be derived based on the small-signal model and S-parameters $S_{11}$, $S_{12}$, $S_{21}$, $S_{22}$, and expressed by the transmission matrix $[T]_Q$:

$$[T]_Q = \qquad (11)$$
$$\frac{1}{2S_{21}}\begin{bmatrix} (1+S_{11})(1-S_{22})+S_{12}S_{21} & Z_{o2L}[(1+S_{11})(1+S_{22})-S_{12}S_{21}] \\ \frac{(1-S_{11})(1-S_{22})-S_{12}S_{21}}{Z_{o1S}} & (1-S_{11})(1+S_{22})+S_{12}S_{21} \end{bmatrix}$$

The equivalent circuit of the output match unit 50 is similar to the equivalent circuit of the input match unit 10 shown in FIG. 2. The output match unit 50 is a second T network comprising the inductors and capacitors, resulting for matching and maximizing the gain of the amplifier 5 and having the second low pass filter response. The inductance of the inductors and the capacitance of the capacitors in the second T network are determined the cutoff frequency and the transmission zero frequency of the second low pass filter response, and a third image impendence of the second T network. The third image impendence of the second T network matches the input and output impendence of the second T network to match the gain of the bandpass amplifier 5. It is noted that the input match unit 10 and the output match unit 50 can also be designed to have bandpass filter response. Although more inductors and capacitors are needed, the elements of the input match unit 10 and the output match unit 50 used for bandpass filter response are also the inductors and capacitors, which the inductance of the inductors and the capacitance of the capacitors are determined the cutoff frequency and the transmission zero frequency of the desired bandpass filter response, and a corresponding image impendence.

The equivalent circuit of the second bias unit 40 is similar to the equivalent circuit of the first bias unit 20 shown in FIG. 3. The second bias unit 40 is a second L network comprising the inductors and capacitors, resulting for driving the second terminal of the amplifier 5 and having the second high pass filter response. The inductance of the inductors and the capacitance of the capacitors in the second L network are determined the cutoff frequency and the transmission zero frequency of the second high pass filter response, and a fourth image impendence of the second L network. The fourth image impendence of the second L network matches the input and output impendence of the second L network to drive the second terminal of the bandpass amplifier 5.

Figure 4:
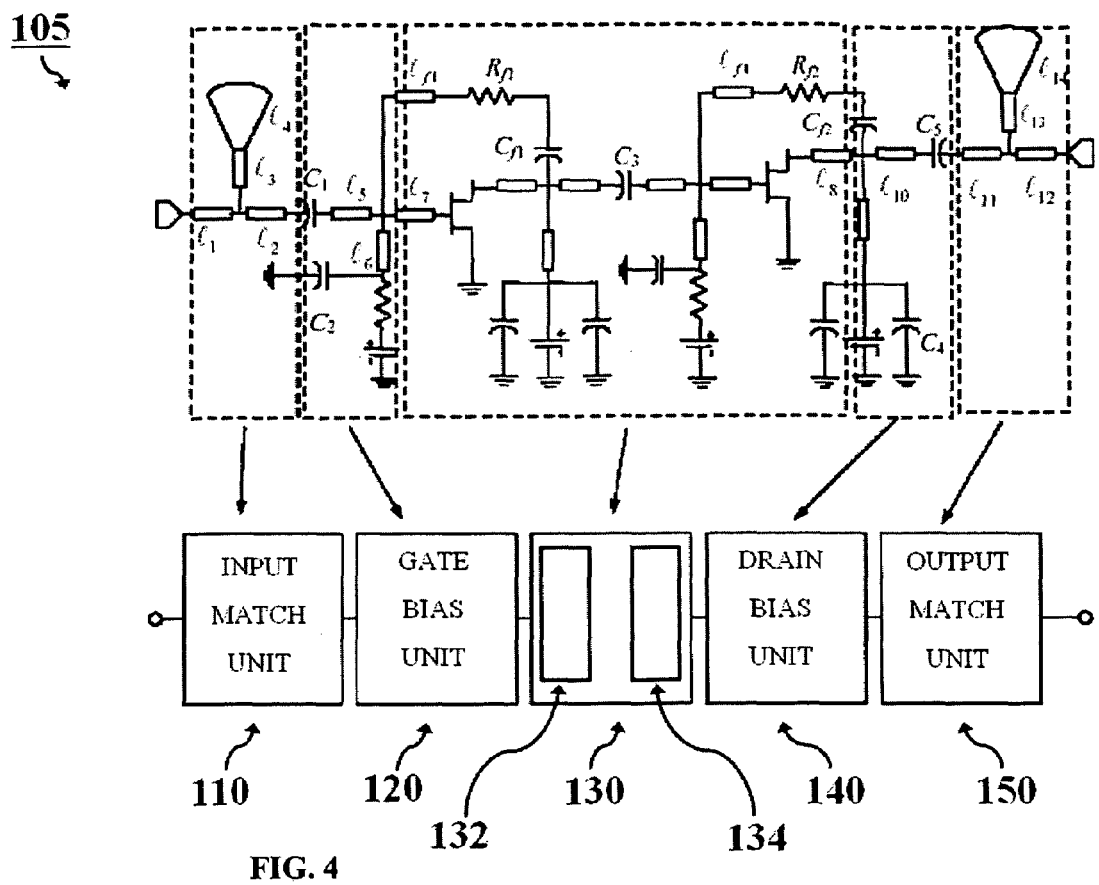
FIG. 4 shows a schematic of a two-stage bandpass amplifier according to the second embodiment of the present invention.

Now referring to FIG. 4, it shows a schematic of a two-stage bandpass amplifier according to the second embodiment of the present invention. The bandpass amplifier 105 comprises an input match unit 110, a first bias unit 120, electrically connected to the input match unit 110; a gain stage 130, electrically connected to the first bias unit 120; a second bias unit 140, electrically connected to the gain stage 130, and an output match unit 150, electrically connected to the second bias unit 140. The input match unit 110, the first bias unit 120, the second bias unit 140 and the output match unit 150 in FIG. 4 are similar to the input match unit 10, the first bias unit 20, the second bias unit 40 and the output match unit 50 respectively in FIG. 1. The main difference between the first embodiment and the second embodiment is the gain stage 130 having two stages 132, 134 for high passband gain. And therefore the bandpass amplifier 105 can be fully described by the transmission matrix multiplication as $$[T]_{bandpass\ amp}=[T]_{LP-in}[T]_{HP-L1}[T]_{Q1}[T]_{Q2}[T]_{HP-L2} \\ [T]_{LP-out} \quad (12)$$

wherein $[T]_{LP-in}$, $[T]_{HP-L1}$, $[T]_{Q1}$, $[T]_{Q2}$, $[T]_{HP-L2}$ and $[T]_{LP-out}$ are the transmission matrixes of the input match unit 110, the first bias unit 120, the gain stage 132, the gain stage 134, the second bias unit 140 and the output match unit 150, respectively.

In one practical embodiment of the invention, a two-stage bandpass amplifier according to the invention is designed for 14-dB passband in 20 to 40 GHz with the suppression of undesired interferences at 7 and 57 GHz. The bandpass amplifier leaves certain design margin to the passband frequency range of 20 to 40 GHz. The lower cutoff frequency is chosen at 18 GHz and the high cutoff frequency is at 44 GHz. The transmission-zero frequencies are chosen right at 7 GHz and 57 GHz. These give $m_T=0.64$ and $m_L=0.92$ for both the input match unit and the output match unit. All the input match unit, the output match unit, and the bias unit are matched to 50 Ω at the center frequency $f_o=30$ GHz, which gives $R_{oT}=68.35$ Ω and $R_{oL}=62.5$ Ω according to Equation (4) and (11).

Then, the lump elements of input match unit 110 with $m_T=0.64$ can be evaluated as $L_1=0.16$ nH, $L_2=0.23$ nH, and $C_2=0.033$ pF, according to Equation (5) to (7). Similarly, the first bias unit 120 has element values from Equation (13) to (15) as $C_3=0.153$ pF, $C_4=0.86$ pF, and $L_4=0.60$ nH. Two resistive-feedback PHEMT transistors are cascaded to supply enough gain.

Figure 5:
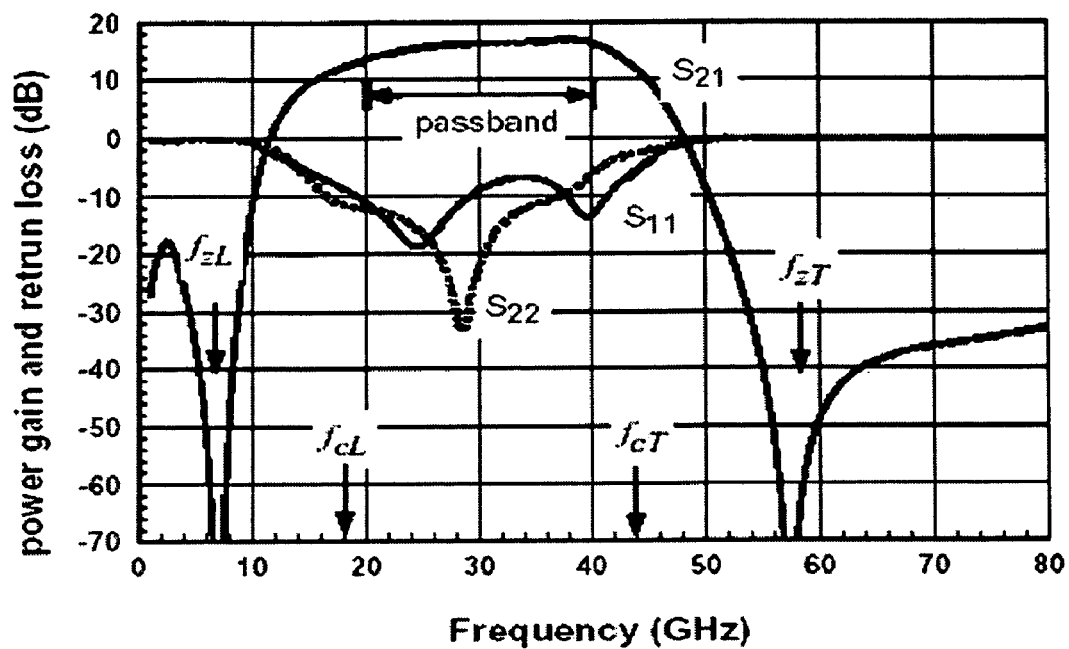
FIG. 5 shows a power gain performance and return loss of a two-stage bandpass amplifier with ideal lumped elements form.

In one practical embodiment of the invention, a two-stage bandpass amplifier according to the invention is designed and fabricated. Now referring to FIG. 5, it shows a power gain and return loss performance of the two-stage bandpass amplifier with the lumped elements form. In general, the angular frequency equals to the frequency multiplied with 2 π. Stop-band transmission zeros are found at 7 and 57 GHz as desired. The passband gain is 15.4 dB with gain ripple of ±1.4 dB over 20-40 GHz. For MMIC realization, the lumped inductor is usually realized with a high-impedance short microstrip line, $\theta=2\ \tan^{-1}(\omega L Z_h)$, and the lumped capacitor is usually replaced with a radial open stub, wherein θ is the electric length of the microstrip line, $Z_h$ denotes for the characteristic impedance of the high-impendence microstrip line. The lumped inductor can also be realized in the lumped type, for example, the spiral inductor and the lumped capacitor can be realized in the lumped type, for example, the interdigital capacitor or metal-insulator-metal insulator (MIM) capacitor. Furthermore, the layout parasitic such as microstrip T-junctions, bends, and via-holes are considered. The whole circuit is then optimized to achieve required passband gain and stop-band attenuation. Then, a two-stage bandpass amplifier according to the invention is fabricated. The semiconductor substrate is AlGaAs/InGaAs/GaAs compound. The PHEMT device is used as the gain stage, which has a typical unit-current-gain cutoff frequency ($f_T$) of greater than 100 GHz and a maximum oscillation frequency ($f_{max}$) of higher than 250 GHz at 2-V drain bias. The chip size of bandpass amplifier is 3×1 mm².

Figure 6:
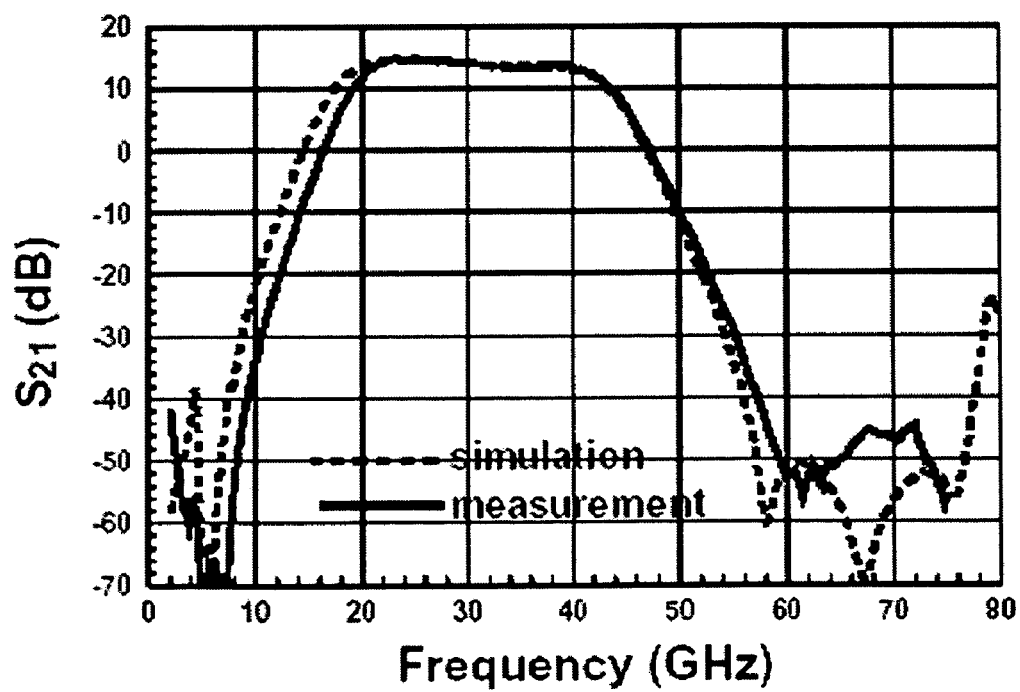
FIG. 6 shows the simulated and measured power gain performance of the two-stage bandpass amplifier according to the second embodiment of the present invention.
Figure 7:
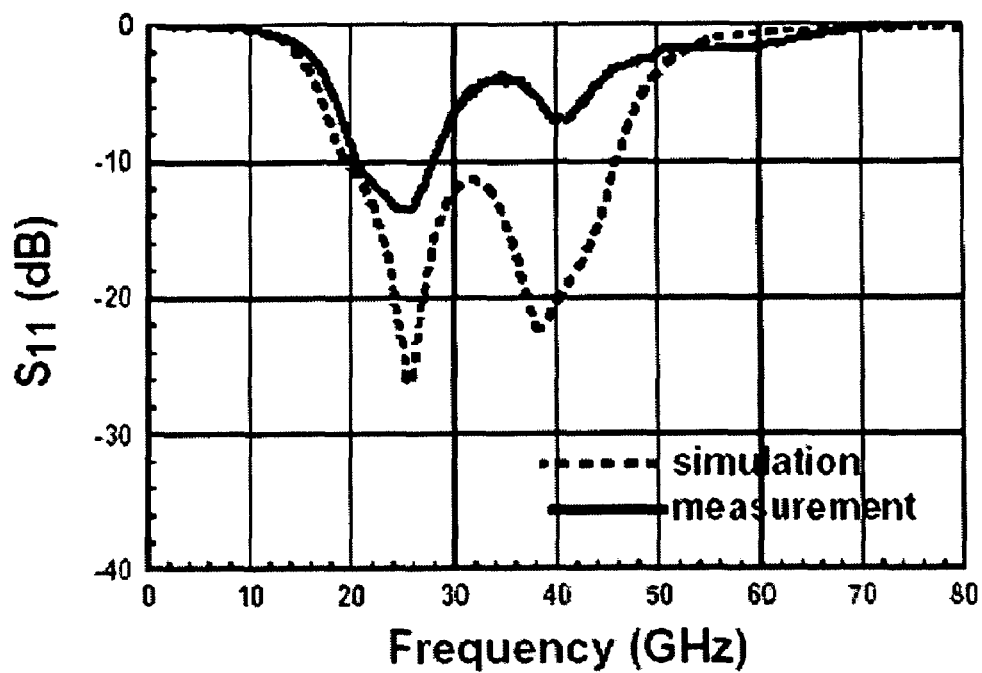
FIG. 7 shows the simulated and measured input return loss performance of the two-stage bandpass amplifier according to the second embodiment of the present invention.
Figure 8:
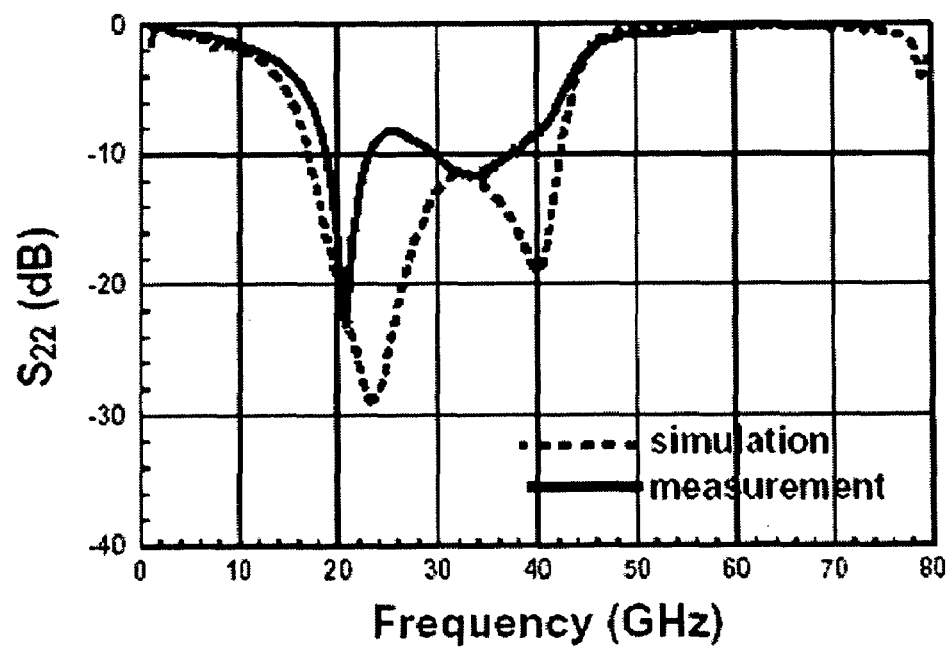
FIG. 8 shows the simulated and measured output return loss performance of the two-stage bandpass amplifier according to the second embodiment of the present invention.
Figure 9:
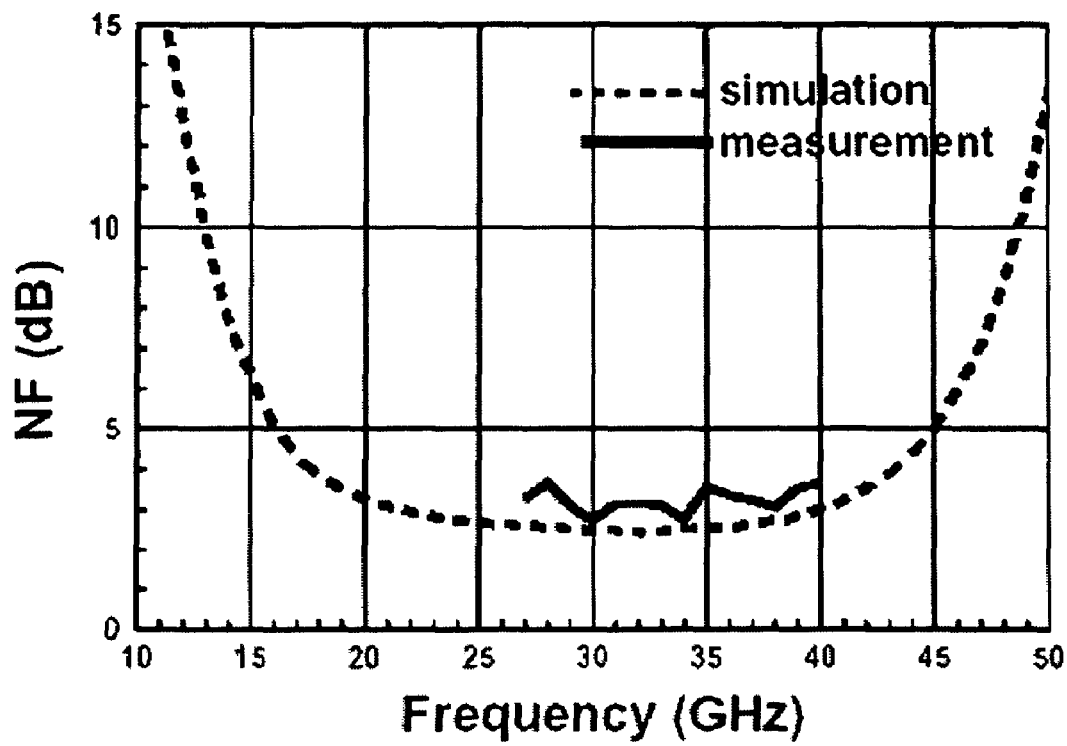
FIG. 9 shows the simulated and measured noise figure of two-stage bandpass amplifier according to the second embodiment of the present invention.

Now referring to FIG. 6, FIG. 7 and FIG. 8, they show the simulated and measured power gain, input return loss and output return loss performance of the two-stage bandpass amplifier according to the second embodiment of the present invention, respectively. The simulation shows good bandpass performance that the passband gain is 13.9±0.7 dB from 20 to 40 GHz, the passband return losses are greater than 10 dB. The simulated stop-band attenuation is 54-dBc below 8 GHz and 64-dBc from 57 to 75 GHz. The measurement shows that the passband gain is 14.2±0.8 dB from 20 to 40 GHz and the passband bandwidth is slightly narrower than the simulation. One low-side transmission zero is clearly observed around 7 GHz, agreeing well with the simulation. Two high-side transmission zeroes are measured at 62 and 75 GHz respectively, which have discrepancy with the simulation. Despite this discrepancy, the transmission zeros effectively give 54-dBc stop-band attenuation from 2 to 9 GHz and from 57 to 75 GHz, which agree very well with the simulation prediction. The measured return losses generally have the same trend but 5-8 dB worse than the simulation. This is due to the probe tip contact and the contact pad parasitic effect when performing the on-wafer measurement. Now referring to FIG. 9, it shows the simulated and measured noise figure performance of the two-stage bandpass amplifier according to the second embodiment of the present invention. The measured noise figure is within 2.7 to 3.7 dB from 27 to 40 GHz, slightly higher than the simulation. It is found that the bandpass amplifier according to the present invention also has low noise figure, suitable for the application of low noise amplifier.

In past, the RF passive filter is constructed from the combination of the inductors, capacitors, resistors, and the transmission line. The RF passive filter is a lossy device, and it has the gain lower than 0 dB. For positive gain, the RF passive filter usually combines with MMIC chips to achieve gain performance and lowest cost. Although the bandpass amplifier in the present invention is considered as an active device, it is noted the first embodiment of the invention can be considered as active filter on the single-chip having positive gain performance.

Figure 10:
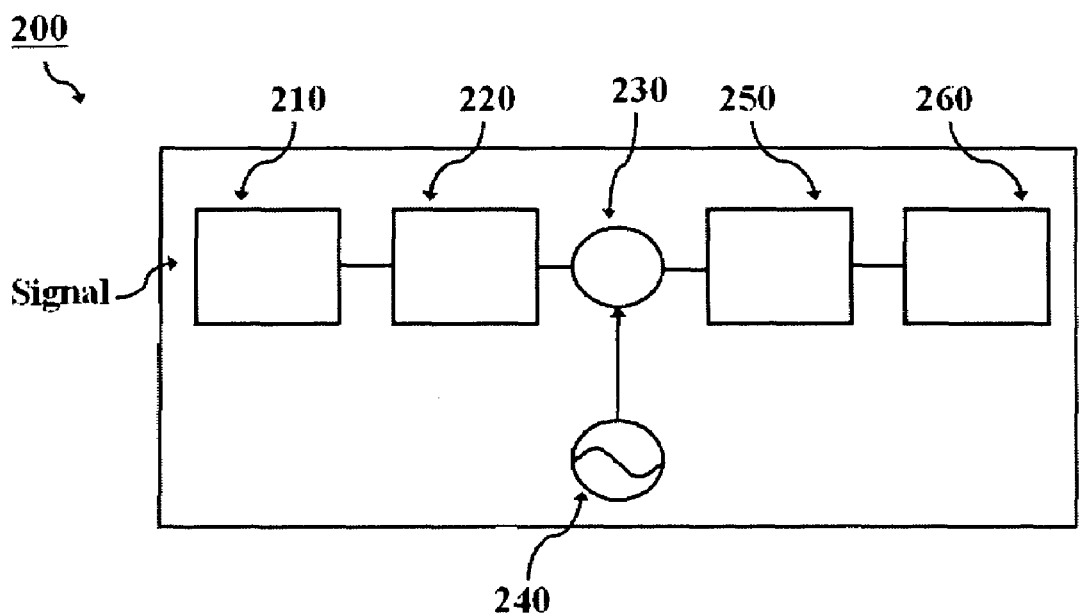
FIG. 10 is a block diagram of a receiver in association without passive bandpass filter.

Now referring to FIG. 10, it is a block diagram of a receiver in association without passive bandpass filter. The receiver 200 comprises an antenna 210, a first bandpass amplifier 220, a mixer 230 having an associated local oscillator 240, a second bandpass amplifier 250, and detector means 260 for determining whether a particular signal has been received.

The signal is picked up by the antenna 210 and passed to the first bandpass amplifier 220 according to the embodiments of the present invention. This amplified signal is passed on to the mixer 230, where it is mixed with the local oscillator signal produced by oscillator 240 to produce upper and lower side bands. The lower side band signal is then amplified by the second bandpass amplifier 250 according to the present invention. The output of the bandpass amplifier 250 is detected and passed to other signalling devices.

According to the preferred embodiment of the present invention, the advantage of the bandpass amplifier is fabricated on the single-chip to have gain and filter performance in the microwave to millimeter-wave range, and therefore the invention can reduce the chip size and fabrication cost.

Another advantage of the bandpass amplifier is that the filter response of the bandpass amplifier can be precisely predicted since the inductance of the inductor and the capacitance of the capacitor are expressed in the closed form.

Another advantage of the bandpass amplifier is that the transmission zero frequency is located in the desired frequency to enhance the stop-band attenuation of the bandpass amplifier.

Another advantage of the present invention is to provide a bandpass circuit on the single-chip having positive gain performance in the microwave to millimeter-wave range.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. An amplifier with three terminals, fabricated on a single chip and having gain and filter performance in a microwave to millimeter-wave range, comprising:
    an input match unit, used for matching the gain of the amplifier and having a first low pass filter response;
    a first bias unit, electrically connected to the input match unit, used for driving a first terminal of the amplifier and having a first high pass filter response;
    a gain stage, electrically connected to the first bias unit, a resistor, a fifth inductor and a first capacitor in series connected between two terminals of the gain stage, used for providing a flat gain of the amplifier;
    a second bias unit, electrically connected to the gain stage, used for driving a second terminal of the amplifier and having a second high pass filter response; and
    an output match unit, electrically connected to the second bias unit, used for matching the gain of the amplifier and having a second low pass filter response;
    where both the input match unit and the output match unit comprise two first inductors with an inductance $L_1$, one second inductor with an inductance $L_2$ and two second capacitors with a capacitance $C_2$ for determining a cutoff frequency $\omega_{cT}$ and a transmission-zero frequency $\omega_{zT}$ of the low pass filter response, and
    wherein both the first bias unit and the second bias unit comprise a fourth inductor with an inductance $L_4$, a third capacitor with an inductance $C_3$ and a fourth capacitor with a capacitance $C_4$, for determining a cutoff frequency $\omega_{cL}$ and a transmission-zero frequency $\omega_{zL}$ of the high pass filter response.

2. An amplifier as claimed in claim 1, wherein the gain stage is a PHEMT, which is implemented on a semiconductor substrate of AlGaAs/InGaAs/GaAs compound.

3. A filter circuit, fabricated on a single chip to have gain and filter performance in a microwave to millimeter-wave range, comprising:
    an amplifier having three terminals;
    an input match unit, used for matching a gain of an amplifier, having a low pass filter response;
    a first bias unit, electrically connected to the input match unit, used for driving a first terminal of the amplifier and having a high pass filter response;
    a gain stage, electrically connected to the first bias unit, a resistor, a fifth inductor and a first capacitor in series connected between two terminals of the gain stage, for providing a flat gain of the amplifier;
    a second bias unit, electrically connected to the gain stage, used for driving a second terminal of the amplifier and having a second high pass filter response; and
    an output match unit, electrically connected to the second bias unit, used for matching the gain of the amplifier and having a second low pass filter response;
    where both the input match unit and the output match unit comprise two first inductors with an inductance $L_1$, one second inductor with an inductance $L_2$ and two second capacitors with a capacitance $C_2$, for determining a cutoff frequency $\omega_{cT}$ and a transmission-zero frequency $\omega_{zT}$ of the low pass filter response, and
    wherein both the first bias unit and the second bias unit comprise a fourth inductor with an inductance $L_4$, a third capacitor with an inductance $C_3$ and a fourth capacitor with a capacitance $C_4$, for determining a cutoff frequency $\omega_{cL}$ and a transmission-zero frequency $\omega_{zL}$ of the high pass filter response.

4. A receiver comprising an antenna, a first bandpass amplifier, a mixer having an associated local oscillator, a second bandpass amplifier, and a detector means for determining whether a particular signal has been received,
    wherein the first and second bandpass amplifiers are fabricated on a single chip to have gain and filter performance in the microwave to millimeter-wave range, each comprises
    an input match unit, used for matching a gain of the amplifier and having a low pass filter response;
    a first bias unit, electrically connected to the input match unit, used for driving a first terminal of the amplifier and having a high pass filter response;
    a gain stage, electrically connected to the first bias unit, a resistor, a fifth inductor and a first capacitor in series connected between two terminals of the gain stage, for providing the flat gain of the amplifier;
    a second bias unit, electrically connected to the gain stage, for driving a second terminal of the amplifier and having the high pass filter response; and
    an output match unit, electrically connected to the second bias unit, used for matching the gain of the amplifier and having the low pass filter response;
    where both the input match unit and the output match unit comprise two first inductors with an inductance $L_1$, one second inductor with an inductance $L_2$ and two second capacitors with a capacitance $C_2$ for determining a cutoff frequency $\omega_{cT}$ and a transmission-zero frequency $\omega_{zT}$ of the low pass filter response, and
    wherein both the first bias unit and the second bias unit comprise a fourth inductor with an inductance $L_4$, a third capacitor with an inductance $C_3$ and a fourth capacitor with a capacitance $C_4$, for determining a cutoff frequency $\omega_{cL}$ and a transmission-zero frequency $\omega_{zL}$ of the high pass filter response.

5. An amplifier as claimed in claim 1, wherein the cutoff frequency $\omega_{cT}$ and a transmission-zero frequency $\omega_{zT}$ of the low pass filter response are expressed as:

$$\omega_{cT} = \frac{1}{\sqrt{(L_1+L_2)C_2}}, \text{ and } \omega_{zT} = \frac{1}{\sqrt{L_2 C_2}}.$$

6. An amplifier as claimed in claim 1, wherein the cutoff frequency $\omega_{cL}$ and a transmission-zero frequency $\omega_{zL}$ of the high pass filter response are expressed as:

$$\omega_{cL} = \sqrt{\frac{1}{L_4}\left(\frac{1}{C_3}+\frac{1}{C_4}\right)}, \text{ and } \omega_{zL} = \frac{1}{\sqrt{L_4 C_4}}.$$

7. An amplifier as claimed in claim 1, wherein the resistor, the fifth inductor and the first capacitor in series connected between the two terminals of the gain stage is an external shunt feedback path of the gain stage.

8. An amplifier as claimed in claim 1, wherein the flat gain of the amplifier is conducted by using a spiral inductor.

9. An amplifier as claimed in claim 1, wherein the first capacitor is one of an inter-digital capacitor and metal-insulator-metal insulator (MIM) capacitor.

10. An amplifier as claimed in claim 1, wherein the flat gain of the amplifier is a ripple less than 1 dB from 20 to 40 GHz.

11. A filter circuit as claimed in claim 3, wherein the cutoff frequency $\omega_{zT}$ and the transmission zero frequency $\omega_{zL}$ of the low pass filter response are expressed as:

$$\omega_{cT} = \frac{1}{\sqrt{(L_1+L_2)C_2}}, \text{ and } \omega_{zT} = \frac{1}{\sqrt{L_2 C_2}}.$$

12. A filter circuit as claimed in claim 3, wherein the cutoff frequency $\omega_{cL}$ and the transmission zero frequency $\omega_{zL}$ of the high pass filter response are expressed as:

$$\omega_{cL} = \sqrt{\frac{1}{L_4}\left(\frac{1}{C_3}+\frac{1}{C_4}\right)}, \text{ and } \omega_{zL} = \frac{1}{\sqrt{L_4 C_4}}.$$

13. A filter circuit as claimed in claim 3, wherein the fifth inductor is a spiral inductor.

14. A filter circuit as claimed in claim 3, wherein the first capacitor is one of an inter-digital capacitor and metal-insulator-metal insulator (MIM) capacitor.

15. A filter circuit as claimed in claim 3, wherein the amplifier has the flat gain with a ripple less than 1 dB from 20 to 40 GHz.

16. A filter circuit as claimed in claim 3, wherein the gate stage is a PHEMT, implemented on a semiconductor substrate of AlGaAs/InGaAs/GaAs compound.

17. A receiver as claimed in claim 4, wherein the cutoff frequency $\omega_{zT}$ and the transmission zero frequency $\omega_{zL}$ of the low pass filter response are expressed as:

$$\omega_{cT} = \frac{1}{\sqrt{(L_1+L_2)C_2}}, \text{ and } \omega_{zT} = \frac{1}{\sqrt{L_2 C_2}}.$$

18. A receiver as claimed in claim 4, wherein the cutoff frequency $\omega_{cT}$ and a transmission-zero frequency $\omega_{zT}$ of the low pass filter response are expressed as:

$$\omega_{cT} = \frac{1}{\sqrt{(L_1+L_2)C_2}}$$

$$\omega_{zT} = \frac{1}{\sqrt{L_2 C_2}}.$$

19. A receiver as claimed in claim 4, wherein the cutoff frequency $\omega_{cL}$ and a transmission-zero frequency $\omega_{zL}$ of the high pass filter response are expressed as:

$$\omega_{cL} = \sqrt{\frac{1}{L_4}\left(\frac{1}{C_3}+\frac{1}{C_4}\right)}$$

$$\omega_{zL} = \frac{1}{\sqrt{L_4 C_4}}.$$

20. A receiver as claimed in claim 4, wherein the gain stage is a PHEMT, implemented on a semiconductor substrate of AlGaAs/InGaAs/GaAs compound.

* * * * *